United States Patent [19]

Margairaz et al.

[11] Patent Number: 5,077,835
[45] Date of Patent: Dec. 31, 1991

[54] RECEIVER CIRCUIT

[75] Inventors: Jacques Margairaz; Pierre-André Farine, both of Neuchâtel; Daniel Beck, Bevaix, all of Switzerland

[73] Assignee: Asulab S.A., Bienne, Switzerland

[21] Appl. No.: 571,047

[22] Filed: Aug. 21, 1990

[30] Foreign Application Priority Data

Aug. 21, 1989 [FR] France ................................. 8911152

[51] Int. Cl.[5] ............................................. H04B 1/26
[52] U.S. Cl. .................................... 455/339; 455/313; 455/340
[58] Field of Search ............... 455/313, 307, 339, 323, 455/340; 307/522, 523; 375/96; 364/724.07

[56] References Cited

U.S. PATENT DOCUMENTS 4,295,105 10/1981 Bingham .

FOREIGN PATENT DOCUMENTS 2118793 11/1983 Japan .

OTHER PUBLICATIONS

Patent Abstracts of Japan, groupe E391, Mar. 28, 1986, vol. 010079.
"A Narrow-Bank CMOS FM Receiver Based on Single-Sideband Modulation IF Filtering", IEEE Journal of Solid-State Circuits, vol. SC-22, Dec. 1987, No. 6, New York pp. 1147-1154, Bang-Sup Song.

Primary Examiner—Reinhard J. Eisenzopf
Assistant Examiner—Chi H. Pham
Attorney, Agent, or Firm—Weil, Gotshal & Manges

[57] ABSTRACT

The receiver circuit comprises an antenna circuit for supplying an antenna signal having a first frequency Fo, a local oscillator for supplying an oscillator signal having a second frequency Flo, a mixer circuit for supplying a mixed signal in response to the antenna signal and to the oscillator signal, a circuit for supplying a clock signal having a third frequency Fck equal to Flo/N in which N is a first constant factor, and a sampled data filter for filtering the mixed signal and having a characteristic frequency Fc equal to Fck/K in which K is a second constant factor. In order to simplify the construction of this receiver the local oscillator is arranged in such a way that Flo=K·N/(K·N±1). The receiver circuit is useful in connection with paging receivers.

2 Claims, 1 Drawing Sheet

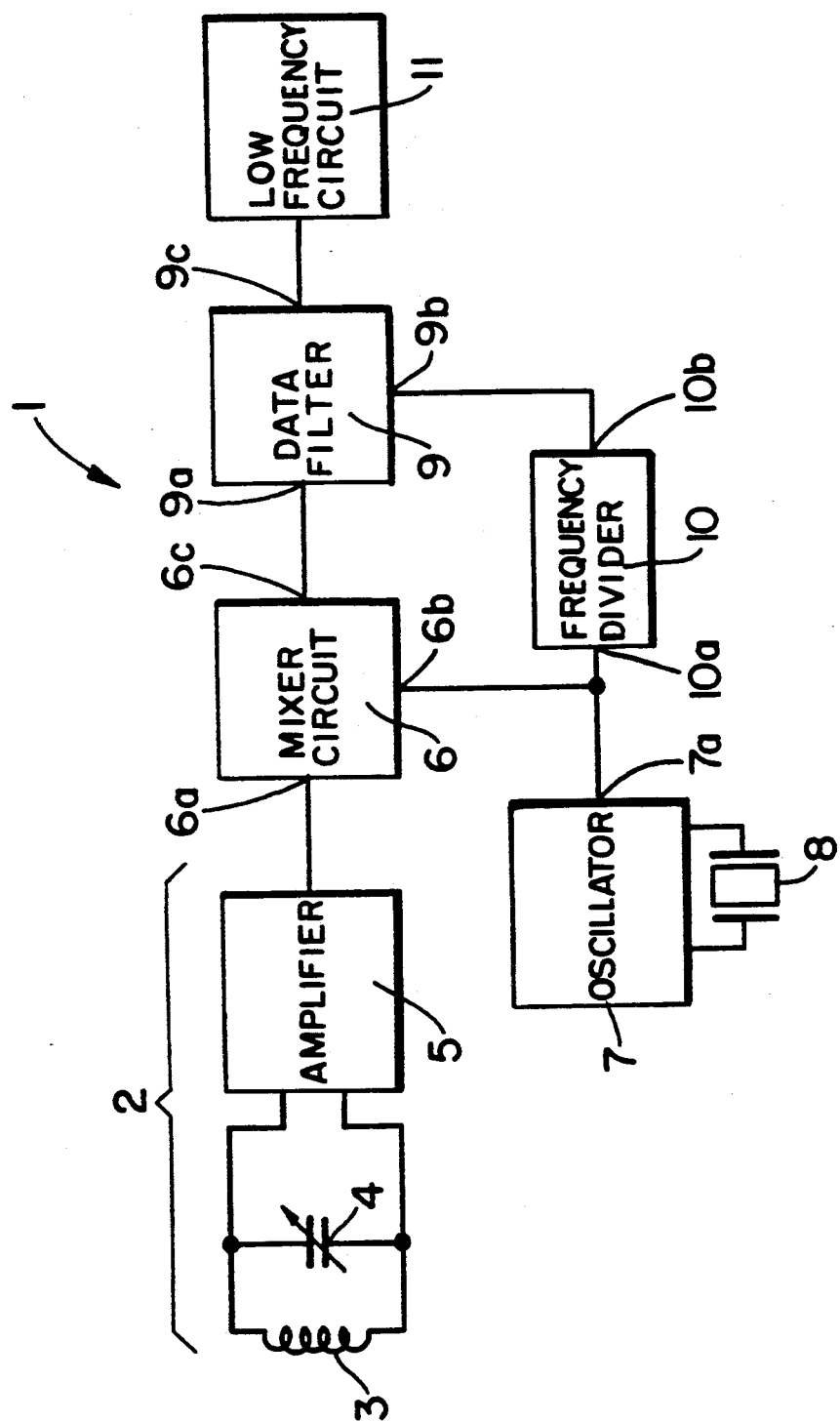

RECEIVER CIRCUIT

BACKGROUND OF THE INVENTION

It is an object of the present invention to provide a receiver circuit comprising an antenna circuit for supplying an antenna signal having a first frequency, a local oscillator for supplying an oscillator signal having a second frequency, a mixer circuit for supplying a mixed signal in response to the antenna signal and to the oscillator signal, means for supplying a clock signal having a third frequency equal to the quotient of the second frequency by a first constant factor, and a sampled data filter for filtering the mixed signal in response to the clock signal and having a characteristic frequency equal to the quotient of the third frequency by a second constant factor.

FIELD OF THE INVENTION

Such receivers are being miniaturised to an increasing degree as a result of progress in integrated circuit production techniques. This miniaturisation has further benefited from the fact that the filter which in these receivers forms part of the low frequency circuit is a sampled data filter, the components of which can be incorporated in the same integrated circuit as the other receiver elements.

Sampled data filters are well known and will not be described here.

It will simply be recalled that they are of two principal types, digital filters and switched capacitor filters. Generally, only the latter are used in receivers because digital filters contain more components and furthermore require the presence of an analog/digital converter.

It will also be recalled that these sampled data filters require a clock signal in order to function.

For a given configuration of the sampled data filter, the frequency of this clock signal determines the characteristic frequency of this filter, in other words its cut-out frequency in the case of a low pass or high pass filter or its centre frequency in the case of a band pass filter. Generally speaking, this frequency of the clock signal must be eight to ten times greater than this characteristic frequency of the filter.

Known receivers therefore generally comprise two oscillators. The first of these which is generally termed the local oscillator is used to produce a reference signal for being mixed with the modulated signal supplied by the antenna circuit. The second of these oscillators is for supplying the clock signal which is necessary for the functioning of the sampled data filter as referred to above.

In cases where these known receivers have to be capable of selectively picking up the transmissions from a number of transmitters having different transmission frequencies, or carrier frequencies, the local oscillator must be designed in such a way that the frequency of the reference signal that it supplies can be modified at the same time as the resonance frequency of the antenna circuit.

In other cases, notably in paging systems in which the receivers are to receive only the transmissions from a sole transmitter having a fixed carrier frequency, the local oscillator must supply a reference signal of which the frequency is similarly fixed. In this case the local oscillator generally comprises a quartz resonator, the characteristics of which determine the frequency of the signal supplied by this oscillator.

The second of the above mentioned oscillators generally also comprises a quartz resonator, the characteristics of which determine the frequency of the clock signal applied to the sampled data filter.

The presence of these two oscillators, and more particularly of the components of these which cannot be incorporated in an integrated circuit, such as the variable condensers and/or the quartz resonators for example, represents an obstacle to the efficient miniaturisation of the receiver, complicates the manufacture of the receiver, also increases its cost of manufacture and the risks of it failing as well as increasing the number of adjustments which need to be made in putting into use the receiver.

DESCRIPTION OF THE PRIOR ART

U.S. Pat. No. 4,484,358 describes a receiver in which these disadvantages are avoided due to the fact that the clock signal applied to the sampled data filter is created by a waveform shaping circuit from the intermediate-frequency signal supplied by the mixer circuit. This known receiver has the disadvantage that the waveform shaping circuit is an anlog circuit, the presence of which increases the number of components in the receiver and the energy consumption of which is rather high.

Patent application JP-A-60-223335 likewise describes a receiver in which the above disadvantages are avoided due to the fact that this receiver comprises only a single oscillator, and that the signal supplied by this oscillator is of fixed frequency.

In this receiver, the clock signal applied to the sampled data filter is supplied by a divider circuit, the input of which is connected to the above mentioned oscillator, and the frequency of this clock signal is thus fixed, as is the characteristic frequency of this filter.

Furthermore, the reference signal applied to the mixer circuit is supplied by a phase-locked-loop circuit which is programmable in such a way that whatever the frequency of the signal supplied by the antenna circuit, the frequency of the mixed signal is equal to the centre frequency of the sampled data filter.

This programmable phase-locked-loop circuit is a relatively complex circuit with a high energy consumption and which comprises notably a voltage controled oscillator and a low pass filter which are analog circuits, some components of which are difficult to produce by conventional techniques of integrated circuit manufacture.

OBJECTS OF THE INVENTION

One object of the present invention is to provide a receiver circuit which does not present the disadvantages of known receivers, that is which comprises only a single oscillator and in which most of the other circuits are circuits of the digital type, the energy consumption of which can be very low.

BRIEF SUMMARY OF THE INVENTION

This object is achieved by the claimed receiver, which comprises an antenna circuit for supplying an antenna signal having a first frequency, a local oscillator for supplying an oscillator signal having a second frequency, a mixer circuit for supplying a mixed signal in response to the antenna signal and to the oscillator signal, means for supplying a clock signal having a third frequency equal to the quotient of the second frequency by a first constant factor, and a sampled data filter for filtering the mixed signal in response to the clock signal and having a characteristic frequency equal to the quotient of the third frequency by a second constant factor, wherein the local oscillator is arranged so that the second frequency is equal to the product of the first frequency by a third constant factor equal to $K \cdot N/(K \cdot N \pm 1)$ in which N and K are equal to the first and second constant factors respectively.

BRIEF DESCRIPTION OF THE DRAWING

The invention will now be described with the aid of the attached drawing in which the only diagram represents, as a non-limitative example, the block diagram of one embodiment of a receiver in accordance with the invention.

DETAILED DESCRIPTION OF THE INVENTION

In this example this receiver, which is identified by reference 1, forms part of a paging installation. It is therefore intended to receive signals having a fixed predetermined carrier frequency. But it will also be made evident in the remainder of this description that it could equally well be intended for selectively picking up signals having carrier frequecies differing from each other.

The receiver 1 comprises an antenna circuit 2 including an antenna 3, a tuning condenser 4 and an amplifier 5. In the example shown, the condenser 4 is a variable condenser, but it will later be seen that in some cases it may also be a fixed condenser.

The signal supplied by the antenna circuit 2 has a carrier frequency determined by the characteristics of the antenna 3 and of the tuning condenser 4, a frequency which is obviously equal to the carrier frequency of the signal produced by the transmitter that the receiver is to pick up. This frequency will be called Fo in the remainder of this description.

The receiver 1 also comprises a mixer circuit 6, of which the input 6a receives the signal supplied by the antenna circuit 2 and of which the input 6b receives the reference signal produced by a local oscillator 7 comprising a quartz resonator 8. The frequency of this reference signal is determined principally by the characteristics of the resonator 8 and will be called frequency Flo in the remainder of this description.

In well known manner, the mixed signal produced by the output 6c of the mixer circuit 6 comprises a large number of components. The only one of these components that is useful is that of which the center frequency, which will be called Fm in the remainder of this description, is equal to the absolute value of the difference between the frequency Fo of the signal supplied by the antenna circuit 2 and the frequency Flo of the reference signal produced by the local oscillator 7.

The other components of the mixed signal are eliminated, in known manner, by a sampled data filter 9, which in the present example is a band pass filter of the switched capacitor type, the input 9a of which is connected to the output 6c of the mixer circuit 6. The clock signal necessary for the functioning of the filter 9 is supplied at its input 9b by the output 10b of a frequency divider circuit 10, of which the input 10a is connected to the output 7a of the local oscillator 7, like the input 6b of the mixer circuit 6. The frequency of this clock signal, which will be called Fck, is therefore equal to the ratio of the frequency Flo of the signal produced by the local oscillator 7 to the rate of division of the divider circuit 10, a rate which will be called N in the remainder of this description.

Furthermore, in well known manner, the centre frequency of the band pass filter 9 which will be called Fc is equal to the ratio of the clock frequency Fck to a factor K which is dependent on the constitution of this filter 9.

The filtered signal present at the output 9c of the filter 9 is applied to the input of a low frequency circuit 11 comprising notably, in the present example, a rectifier and a decoder circuit capable of recognising the specific code attributed to the receiver of which it forms part and of triggering the transmission of an audible signal in response to receiving this code.

The various circuits and components which have been enumerated will not be described in detail as they are conventional and are well known by specialists. It is simply to be noted that for preference, the amplifier 5, the mixer circuit 6, the oscillator 7, the filter 9, the frequency divider 10 and the low frequency circuit 11 are incorporated in one and the same integrated circuit.

In order for the receiver 1 just described to function correctly, it is of course necessary that the centre frequency Fc of the filter 9 is equal to the centre frequency Fm of the useful component of the mixed signal.

Now, as has been seen above, the frequency Fm is equal to the absolute value of the difference between the frequency Fo of the signal supplied by the antenna circuit 2 and the frequency Flo of the reference signal supplied by the local oscillator 7. The equation $$Fc = |Fo - Flo| \qquad (1)$$

must therefore be verified.

Furthermore, the centre frequency Fc of the filter 9 is given by the equation $$Fc = \frac{1}{K} \cdot Fck,$$

which may also be written $$Fc = \frac{1}{K \cdot N} \cdot Flo \qquad (2)$$

since $$Fck = \frac{1}{N} \cdot Flo$$

By combining the above equations 1 and 2 it may easily be seen that the functioning condition imposed by equation 1 is fulfilled when $$Flo = \frac{K \cdot N}{K \cdot N \pm 1} \cdot Fo \qquad (3)$$

This equation 3 shows that whatever the values chosen for K and N, it is always possible to determine, for each value of the frequency Fo, two distinct values of the frequency Flo (the one lower and the other higher than this frequency Fo) for which the functioning condition imposed above is fulfilled.

This means that it is always possible to produce a receiver in accordance with the present invention which has the advantage over the majority of known receivers in not containing any oscillator specifically dedicated to supplying the clock signal of the sampled data filter.

The absence of the latter oscillator in receivers in accordance with the invention, and especially the absence of the components of this oscillator which cannot be incorporated in an integrated circuit, increases the possibilities for these receivers to be miniaturised, simplifies their manufacture and thus simultaneously reduces their cost of manufacture and the risks of their failure.

Furthermore, compared with the known receivers described in U.S. Pat. No. 4,484,358 or in Patent application JP-A-60-223335 mentioned above, the receiver in accordance with the invention has the advantage that it does not require any analog circuit for supplying the clock signal necessary for the functioning of its sampled data filter or for supplying the reference signal applied to its mixer circuit, and that all its components, with the exception of course of its antenna 3, of its tuning condenser 4 and of its resonator 8, can be very easily produced in one and the same integrated circuit, the electrical energy consumption of which is very low.

It is to be noted that the already mentioned absence of an oscillator specifically dedicated to supplying the clock signal of the sampled data filter in receivers in accordance with the invention has the consequence, as shown by the above equations, that the centre frequency Fc of this filter is dependent upon the centre frequency Fo of the signal that these receivers are to pick up. This center frequency Fc of the sampled data filter may thus differ from one receiver to another. This difference is of no consequence, however, since whatever this centre frequency Fc, it is automatically equal to the centre frequency Fm of the component of the mixed signal that the sampled data filter has to select.

It may be seen that when the receiver 1 forms part of a paging installation it suffices to equip it, together of course with the other receivers forming part of the same installation, with a quartz resonator 8 selected in such a way that the local oscillator 7 produces a signal having one of the two frequencies which can be calculated using the above equation 3 for the carrier frequency of the signal transmitted by the installation transmitter. Furthermore, in such a case, the tuning condenser 4 of the antenna circuit 2 can be a fixed condenser since this carrier frequency is itself fixed.

In the case of the receiver in accordance with the invention being intended for selectively receiving the signals transmitted by several separate transmitters with different carrier frequencies, it suffices to couple, for instance mechanically, the tuning condenser 4 of the antenna circuit 2 to the element determining the frequency of the signal produced by the local oscillator 7, an element which in this case is obviously not a quartz resonator but which is generally another variable condenser. This coupling between the tuning condenser 2 and this element determining the frequency of the signal produced by the local oscillator 7 must of course be produced in such a way that the latter frequency corresponds, for each carrier frequency, to that which can be determined using the above equation 3.

It is also to be noted that for obvious reasons of simplicity, the rate of division N of the frequency divider 10 will be selected, for preference, at a value equal to one of the whole powers of 2, such as 2, 4, 8 etc.

It is similarly to be noted that this frequency divider 10 is not absolutely essential, and that it is quite possible to connect the clock input 9b of the sampled data filter 9 directly to the output 7a of the local oscillator 7. In this case, the factor N in the above equations is obviously equal to 1 and the frequency Flo of the signal that the local oscillator has to produce to fulfil the above functioning condition is then given by $$Flo = \frac{K}{K \pm 1} \cdot Fo \quad (4)$$

However, as the amount of electrical energy consumed by the sampled data filter 9 is directly proportional to the frequency of the clock signal applied to its input 9b, for preference such a solution will not be adopted in cases where the dimensions and consequently the capacity of the source supplying this electrical energy are limited, i.e. notably in cases where the amplifier 1 forms part of a portable device.

In fact, the reduction in consumption of electrical energy by the filter 9 due to the lowering of the frequency of its clock signal resulting from the presence of the divider 10 is distinctly greater than the amount of electrical energy consumed by the latter, especially if this divider is produced using complementary MOS transistors.

Furthermore, it is well known that the amplitude variation of a signal transmitted by a sampled data filter as a function of the frequency of this signal is more rapid, on either side of the center frequency of this filter, the lower the frequency of the clock signal applied to this latter. As generally the attempt is made to make this variation as rapid as possible in order to improve the filtration of the signal produced by the mixer circuit 6, it may be seen that it is advantageous, from this aspect likewise, not to connect the clock input 9b of the switched capacitor filter 9 directly to the output 7a of the local oscillator 7, but to interpose the frequency divider circuit 10 between this input and this output.

We claim:
1. A receiver circuit comprising:
    an antenna circuit for supplying an antenna signal having a first frequency;
    a local oscillator for supplying an oscillator signal having a second frequency;
    a mixer circuit for supplying a mixed signal in response to said antenna signal and to said oscillator signal;
    means for supplying a clock signal having a third frequency equal to the quotient of said second frequency by a first constant factor; and
    a sampled data filter for filtering said mixed signal in response to said clock signal and having a characteristic frequency equal to the quotient of said third frequency by a second constant factor;
    wherein said local oscillator is arranged in such a way that said second frequency is equal to the product of said first frequency by a third constant factor equal to K·N/(K·N±1), in which N and K are equal to said first and
    said second constant factors respectively.
2. A receiver circuit in accordance with claim 1, wherein
    said means for producing said clock signal comprises a frequency divider circuit of which the input is connected to the output of said local oscillator, of which the output supplies said clock signal and of which the division rate is equal to said first constant factor.

* * * * *